(12) United States Patent
Saini

(10) Patent No.: US 11,606,029 B2
(45) Date of Patent: Mar. 14, 2023

(54) DC-DC VOLTAGE CONVERTER WITH FLOATING RAIL GENERATION FOR CASCODE TRANSISTOR BIASING

(71) Applicant: STMicroelectronics International N.V., Geneva (CH)

(72) Inventor: Pravesh Kumar Saini, Greater Noida (IN)

(73) Assignee: STMicroelectronics International N.V., Geneva (CH)

(*) Notice: Subject to any disclaimer, the term of this patent is extended or adjusted under 35 U.S.C. 154(b) by 275 days.

(21) Appl. No.: 17/016,588

(22) Filed: Sep. 10, 2020

(65) Prior Publication Data

US 2022/0077776 A1 Mar. 10, 2022

(51) Int. Cl.
*H02M 3/158* (2006.01)
*H02M 1/088* (2006.01)
*H02M 1/00* (2006.01)
*H03K 17/10* (2006.01)

(52) U.S. Cl.
CPC ............ *H02M 3/158* (2013.01); *H02M 1/00* (2013.01); *H02M 1/088* (2013.01); *H02M 1/0006* (2021.05); *H03K 17/102* (2013.01); *H03K 2217/0081* (2013.01)

(58) Field of Classification Search
None
See application file for complete search history.

(56) References Cited

U.S. PATENT DOCUMENTS 5,399,960 A * 3/1995 Gross .................. G05F 3/245
327/541
5,530,394 A 6/1996 Blossfeld et al.
5,543,740 A * 8/1996 Wong .................. H03K 17/063
327/108
2002/0163365 A1* 11/2002 Jung ................ H03K 19/00315
327/108
2017/0271195 A1* 9/2017 Høyerby ............... H01L 27/092
2019/0334516 A1 10/2019 Itoh et al.

OTHER PUBLICATIONS

Hazucha, Peter, et al: "High Voltage Tolerant Linear Regulator With Fast Digital Control for Biasing of Integrated DC-DC Converters," IEEE Journal of Solid-State Circuits, vol. 42, No. 1, Jan. 2007, pp. 66-73.
Nam, Hyunseok, et al: "5-V Buck Converter Using 3.3-V Standard CMOS Process With Adaptive Power Transistor Driver Increasing Efficiency and Maximum Load Capacity," IEEE Transactions on Power Electronics, vol. 27, No. 1, Jan. 2012, pp. 463-471.
EPO Search Report and Written Opinion for family-related EP Appl. No. 21192626.6, dated Feb. 4, 2022, 9 pages.

* cited by examiner

*Primary Examiner* — Matthew V Nguyen
(74) *Attorney, Agent, or Firm* — Crowe & Dunlevy

(57) ABSTRACT

A power transistor and a cascode transistor are connected in series. A driver circuit has an output driving a control terminal of the power transistor. The driver circuit has a first power supply node coupled to receive a floating voltage that is also applied to a control terminal of the cascode transistor. A variable voltage generator generates the floating voltage. The floating voltage track either a power supply voltage or a reference voltage over a first range of voltage levels for the power supply voltage. The floating voltage further satisfies a ratio metric relationship dependent on the power supply voltage and reference voltage over a second range of voltage levels for said power supply voltage.

17 Claims, 4 Drawing Sheets

DC-DC VOLTAGE CONVERTER WITH FLOATING RAIL GENERATION FOR CASCODE TRANSISTOR BIASING

TECHNICAL FIELD

This disclosure is related to the field of DC-DC voltage converters and, in particular, to the biasing of cascode transistors within an output bridge circuit.

BACKGROUND

FIG. 1 shows a circuit diagram of a conventional DC-DC voltage converter circuit 10. The voltage converter circuit 10 includes a transistor bridge circuit including a high side transistor drive circuit 12 and a low side transistor drive circuit 14 coupled in series with each other between a supply voltage node 16 providing a supply voltage Vdd and a reference voltage node 18 providing a reference voltage Gnd. The current conduction paths through the high side transistor drive circuit 12 and the low side transistor drive circuit 14 are connected at a switched output node 20. The high side transistor drive circuit 12 may, for example, comprise a p-channel power metal oxide semiconductor field effect transistor (MOSFET) device MP1 having a source terminal connected to supply voltage node 16 and a drain terminal connected to the switched output node 20. The low side transistor drive circuit 14 may, for example, comprise an n-channel power MOSFET device MN1 having a source terminal connected to reference voltage node 18 and a drain terminal connected to the switched output node 20. The high side transistor drive circuit 12 is driven by a high side drive signal pgate that is output by a high side gate driver circuit 32. The low side transistor drive circuit 14 is driven by a low side drive signal ngate that is output by a low side gate driver circuit 34. A pulse width modulation (PWM) control circuit 38 generates non-overlapping PWM control signals p-PWM and n-PWM that are applied, respectively, to the inputs of the high side gate driver circuit 32 and the low side gate driver circuit 34 which then output the high side drive signal pgate and the low side drive signal ngate.

In an implementation where the DC-DC voltage converter circuit 10 is a buck converter, an inductor L has a first terminal connected to the switched output node 20 and a second terminal connected to a DC output node 40 where an output voltage Vout is generated and applied to a load (represented by capacitor C). The output voltage Vout is sensed by a voltage sensing circuit 44 to generate a feedback voltage Vfb. The voltage sensing circuit 44 may, for example, comprise a resistive divider circuit. The PWM control circuit 38 uses the feedback voltage Vfb to control the pulse widths of the non-overlapping PWM control signals p-PWM and n-PWM and thus regulate a voltage level of the output voltage Vout.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In an embodiment, a circuit is powered by a power supply voltage and a reference voltage and comprises: a power transistor; a cascode transistor; wherein the power transistor and cascode transistor are connected in series; a driver circuit having an output driving a control terminal of the power transistor, wherein the driver circuit has a first power supply node coupled to receive a floating voltage that is also applied to a control terminal of the cascode transistor; and a variable voltage generator configured to generate the floating voltage, said variable voltage generator generating the floating voltage to track either the power supply voltage or the reference voltage over a first range of voltage levels for said power supply voltage and further generating the floating voltage to satisfy a ratio metric relationship dependent on the power supply voltage and reference voltage over a second range of voltage levels for said power supply voltage.

In an embodiment, a circuit comprises: a high side power transistor; a high side cascode transistor; wherein the high side power transistor and high side cascode transistor are connected in series between a power supply voltage and a switching node; a low side power transistor; a low side cascode transistor; wherein the low side power transistor and low side cascode transistor are connected in series between the switching node and a reference voltage; a high side driver circuit having an output driving a control terminal of the high side power transistor, wherein the high side driver circuit has a first power supply node coupled to receive the power supply voltage and a second power supply node coupled to receive a floating ground voltage that is also applied to a control terminal of the high side cascode transistor; a low side driver circuit having an output driving a control terminal of the low side power transistor, wherein the low side driver circuit has a first power supply node coupled to receive a floating supply voltage that is also applied to a control terminal of the low side cascode transistor and a second power supply node coupled to receive the reference voltage. A first variable voltage generator is configured to generate the floating ground voltage, wherein the floating ground voltage tracks the reference voltage over a first range of voltage levels for said power supply voltage and further satisfies a first ratio metric relationship dependent on the power supply voltage and reference voltage over a second range of voltage levels for said power supply voltage. A second variable voltage generator is configured to generate the floating supply voltage, wherein the floating supply voltage tracks the power supply voltage over the first range of voltage levels for said power supply voltage and further satisfies a second ratio metric relationship dependent on the power supply voltage and reference voltage over the second range of voltage levels for said power supply voltage. The first and second ratio metric relationships are different.

DETAILED DESCRIPTION

In the following detailed description and the attached drawings, specific details are set forth to provide a thorough understanding of the present disclosure. However, those skilled in the art will appreciate that the present disclosure may be practiced, in some instances, without such specific details. In other instances, well-known elements have been illustrated in schematic or block diagram form in order not to obscure the present disclosure in unnecessary detail. Additionally, for the most part, specific details, and the like, have been omitted inasmuch as such details are not considered necessary to obtain a complete understanding of the present disclosure, and are considered to be within the understanding of persons of ordinary skill in the relevant art.

Figure 1:
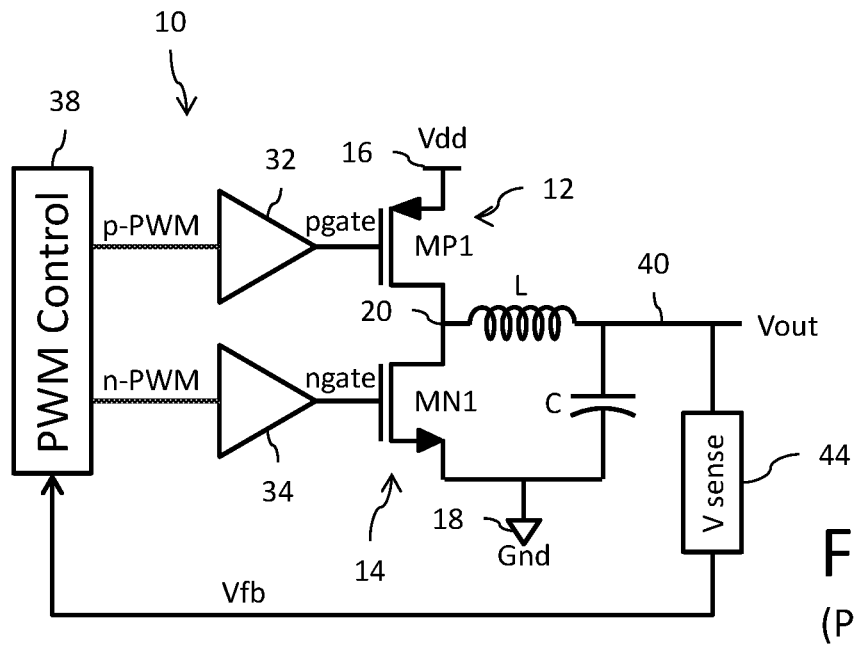
FIG. 1 is a circuit diagram of a conventional DC-DC voltage converter circuit.
Figure 2:
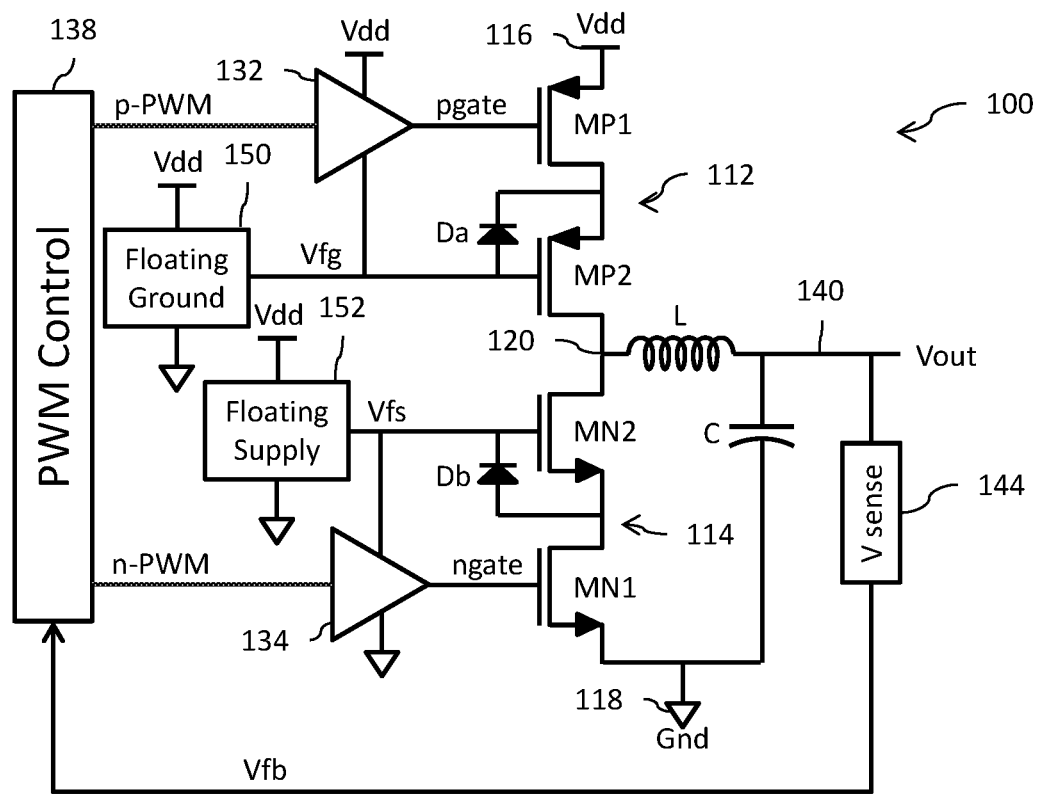
FIG. 2 is a circuit diagram of a DC-DC voltage converter circuit.

Reference is now made to FIG. 2 which shows a circuit diagram of a DC-DC voltage converter circuit 100. The voltage converter circuit 100 includes a transistor bridge circuit including a high side transistor drive circuit 112 and a low side transistor drive circuit 114 coupled in series with each other between a supply voltage node 116 providing a supply voltage Vdd and a reference voltage node 118 providing a reference voltage Gnd. The current conduction paths through the high side transistor drive circuit 112 and the low side transistor drive circuit 114 are connected at a switched output node 120. The high side transistor drive circuit 112 comprises a p-channel power metal oxide semiconductor field effect transistor (MOSFET) device MP1 having a source terminal connected to supply voltage node 116 and a drain terminal and a p-channel cascode MOSFET device MP2 having a drain terminal connected to the switched output node 120 and a source terminal connected to the drain terminal of device MP1. The low side transistor drive circuit 114 comprises an n-channel power MOSFET device MN1 having a source terminal connected to reference voltage node 118 and a drain terminal and an n-channel cascode MOSFET device MN2 having a drain terminal connected to the switched output node 120 and a source terminal connected to the drain terminal of device MN1. The use of cascode transistors MP2 and MN2 in the transistor bridge circuit supports operation of the DC-DC voltage converter circuit 100 at higher voltage levels (for example, 8.0V) of the supply voltage Vdd.

The p-channel power MOSFET device MP1 is driven by a high side drive signal pgate that is output by a high side gate driver circuit 132. The p-channel cascode MOSFET device MP2 is driven (i.e., biased) by a floating ground voltage Vfg that is generated by a floating ground voltage generator circuit 150. The low side transistor drive circuit 114 is driven by a low side drive signal ngate that is output by a low side gate driver circuit 134. The n-channel cascode MOSFET device MN2 is driven (i.e., biased) by a floating supply voltage Vfs that is generated by a floating supply voltage generator circuit 152. A pulse width modulation (PWM) control circuit 138 generates non-overlapping PWM control signals p-PWM and n-PWM that are applied, respectively, to the inputs of the high side gate driver circuit 132 and the low side gate driver circuit 134 which then output the high side drive signal pgate and the low side drive signal ngate.

A diode Da has an anode coupled to the gate of p-channel cascode MOSFET device MP2 and a cathode connected to the series connection node between the drain of p-channel power MOSFET device MP1 and the source of p-channel cascode MOSFET device MP2. A diode Db has a cathode coupled to the gate of n-channel cascode MOSFET device MN2 and an anode connected to the series connection node between the drain of n-channel power MOSFET device MN1 and the source of n-channel cascode MOSFET device MN2. The diodes Da and Db address a reliability concern which arises due to leakage of the MOSFETs. In this regard, when the leakage of transistor MP2 exceeds the leakage of transistor MP1, the drain of transistor MP1 can discharge to an unacceptable voltage level (for example, 0V) leading to reliability concerns with transistor MP1. The diode D1 ensures that the source of transistor MP2 is kept at a voltage level where transistor MP1 is in a safe region of operation. The diode Db performs a similar function relative to transistor MN1.

The power supply nodes of the high side gate driver circuit 132 are connected to receive the supply voltage Vdd and the floating ground voltage Vfg. The high side gate driver circuit 132 accordingly functions to level shift the PWM control signal p-PWM to generate the high side drive signal pgate having a voltage range between Vfg and Vdd. The power supply nodes of the low side gate driver circuit 134 are connected to receive the floating supply voltage Vfs and the reference voltage Gnd. The low side gate driver circuit 134 accordingly functions to level shift the PWM control signal n-PWM to generate the low side drive signal ngate having a voltage range between Gnd and Vfs.

In an implementation where the DC-DC voltage converter circuit 100 is a buck converter, an inductor L has a first terminal connected to the switched output node 120 and a second terminal connected to a DC output node 140 where an output voltage Vout is generated and applied to a load (represented by capacitor C). The output voltage Vout is sensed by a voltage sensing circuit 44 to generate a feedback voltage Vfb. The voltage sensing circuit 144 may, for example, comprise a resistive divider circuit. The PWM control circuit 138 uses the feedback voltage Vfb to control the pulse widths of the non-overlapping PWM control signals p-PWM and n-PWM and thus regulate a voltage level of the output voltage Vout.

Figure 3:
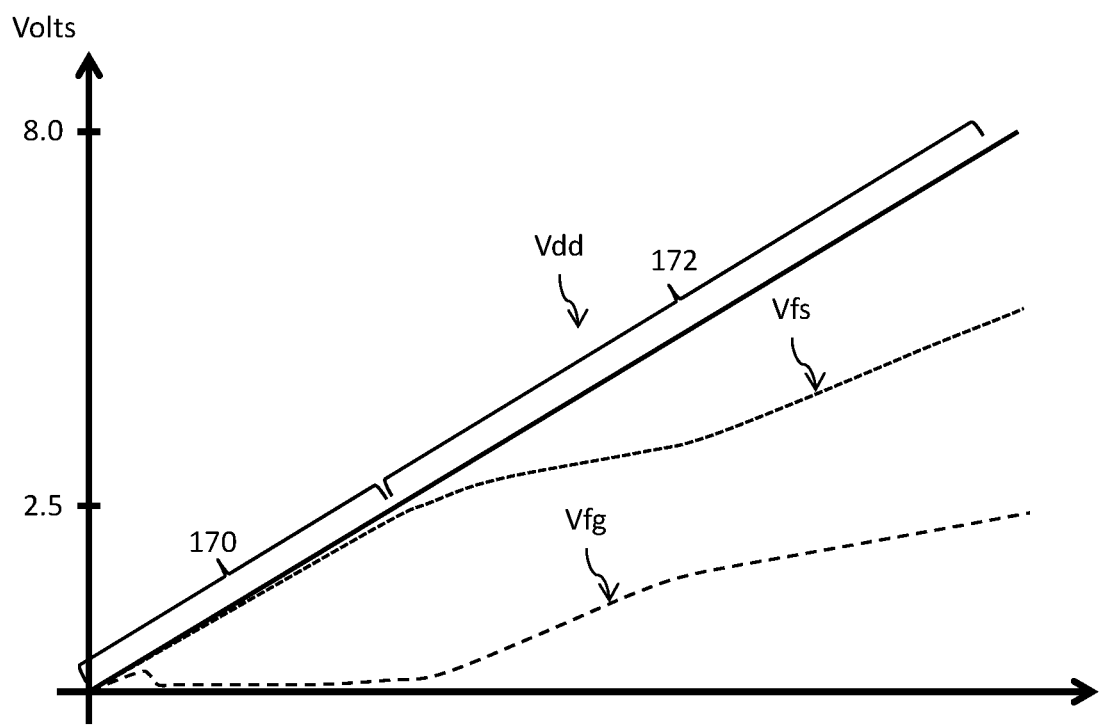
FIG. 3 is a graph illustrating a relationship between supply voltage level and floating ground level and between supply voltage level and floating supply level.

The power supply nodes of the floating ground voltage generator circuit 150 are connected to receive the supply voltage Vdd and the reference voltage Gnd. The floating ground voltage generator circuit 150 is a variable voltage generator where the level of the floating ground voltage Vfg that is generated is dependent on the levels of the supply voltage Vdd and reference voltage Gnd. This is illustrated in FIG. 3. Over a first range 170 of supply voltage Vdd levels (in the illustrated example, from 0V to about 2.5V), the level of the floating ground voltage Vfg tracks (i.e., follows, is substantially equal to) the reference voltage Gnd. Within the relatively lower supply voltage range shown by first range 170, the floating ground voltage generator circuit 150 generates the bias voltage for the cascode transistor device MP2 so that a higher overdrive voltage is provided allowing the high side gate driver circuit 132 to work reliably without exceeding the technology limits of the MOSFET safe operating area (SOA) voltages for the devices MP1 and MP2 of the high side transistor drive circuit 112. Over a second range 172 of supply voltage Vdd levels (in the illustrated example, from about 2.5V to 8.0V), the level of the floating ground voltage Vfg is controlled to satisfy a first ratio metric relationship dependent on the levels of the supply voltage Vdd and the reference voltage Gnd (for example, the first ratio metric relationship may generally be a function of the ratio:(Vdd-Gnd)/3). Within the relatively higher supply voltage range shown by second range 172, the floating ground voltage generator circuit 150 generates the bias voltage for the cascode transistor device MP2 so that the devices MP1 and MP2 of the high side transistor drive circuit 112 do not exceed the allowed MOSFET safe operating area (SOA) voltages.

The power supply nodes of the floating supply voltage generator circuit 152 are connected to receive the supply voltage Vdd and the reference voltage Gnd. The floating supply voltage generator circuit 152 is a variable voltage generator where the level of the floating supply voltage Vfs that is generated is dependent on the levels of the supply voltage Vdd and reference voltage Gnd. This is illustrated in FIG. 3. Over the first range 170 of supply voltage Vdd levels (in the illustrated example, from 0V to about 2.5V), the level of the floating supply voltage Vfs tracks (i.e., follows, is substantially equal to) the reference voltage Gnd. Within the relatively lower supply voltage range shown by first range 170, the floating supply voltage generator circuit 152 generates the bias voltage for the cascode transistor device MN2 so that a higher overdrive voltage is provided allowing the low side gate driver circuit 134 to work reliably without exceeding the technology limits of the MOSFET safe operating area (SOA) voltages for the devices MN1 and MN2 of the low side transistor drive circuit 114. Over the second range 172 of supply voltage Vdd levels (in the illustrated example, from about 2.5V to 8.0V), the level of the floating supply voltage Vfs is controlled to satisfy a second ratio metric relationship dependent on the levels of the supply voltage Vdd and the reference voltage Gnd (for example, the second ratio metric relationship may generally be a function of the ratio:(2*(Vdd−Gnd))/3). Within the relatively higher supply voltage range shown by second range 172, the floating supply voltage generator circuit 152 generates the bias voltage for the cascode transistor device MN2 so that the devices MN1 and MN2 of the low side transistor drive circuit 114 do not exceed the allowed MOSFET safe operating area (SOA) voltages.

Figure 4:
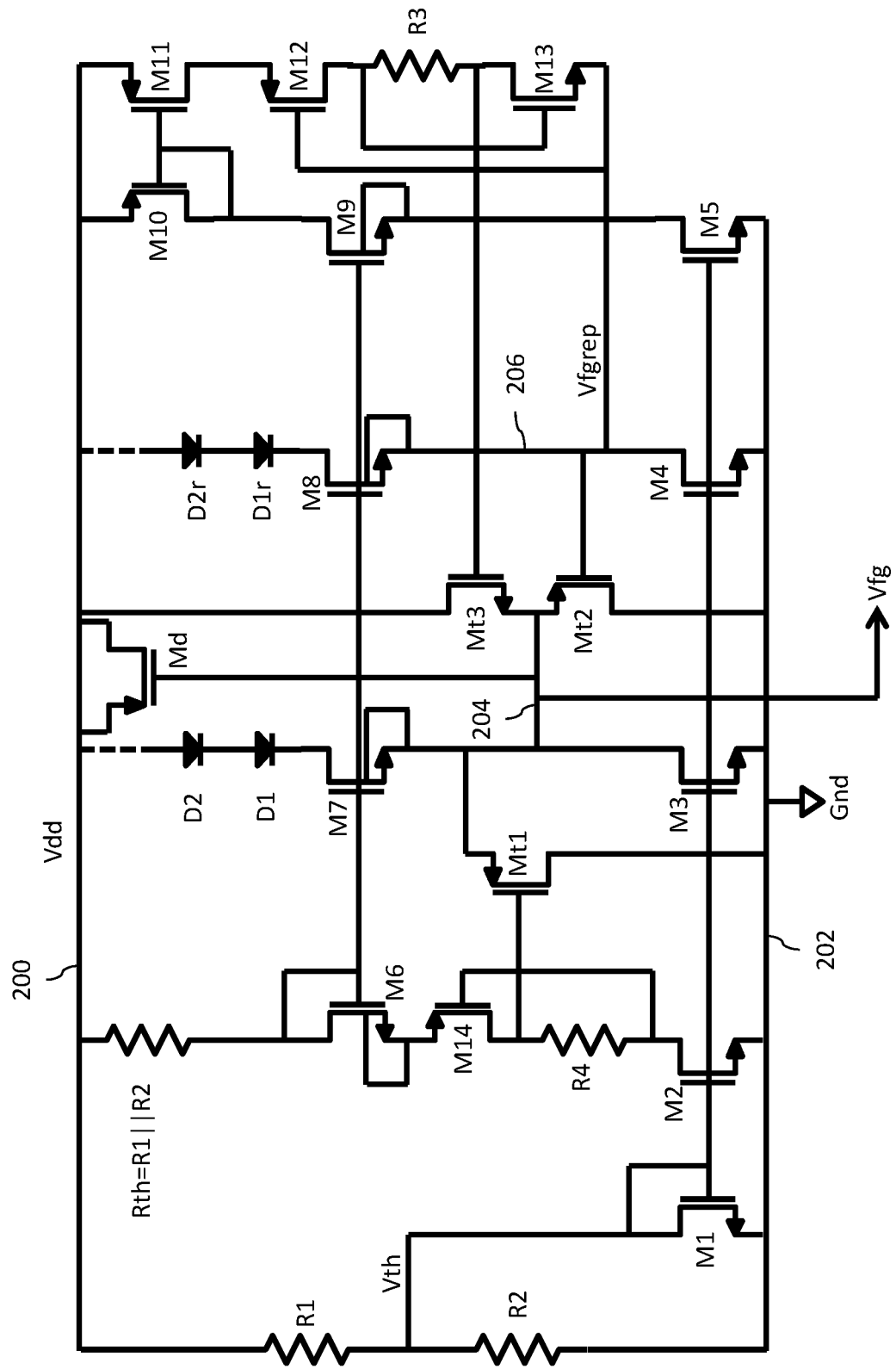
FIG. 4 is a circuit diagram for a floating ground voltage generator for cascode biasing.

Reference is now made to FIG. 4 which shows a circuit diagram for the floating ground voltage generator circuit 150 powered from the supply voltage Vdd at node 200 and the reference voltage Gnd at node 202. A resistive voltage divider formed by series connected resistors R1 and R2 generates an intermediate voltage Vth. A diode-connected n-channel MOSFET device M1 is coupled between the tap node of the resistive voltage divider and the node 202, with the source of device M1 connected to node 202 and the gate and drain of device M1 connected to the tap node of the resistive voltage divider. An n-channel MOSFET device M2 has a gate coupled to the gate of device M1 and a source connected to node 202. A resistor R4 has a first terminal connected to the drain of device M2 and a second terminal connected to the drain of a p-channel MOSFET device M14. The gate of device M14 is connected to the first terminal of the resistor R4. The source of device M14 is connected to the source (and body) of a diode connected n-channel MOSFET device M6. The gate and drain of device M6 are connected to the first terminal of a resistor Rth, where Rth=R1∥R2. A second terminal of resistor Rth is connected to the node 200. An n-channel MOSFET device M3 has a gate coupled to the gate of device M1 and a source connected to node 202. An n-channel MOSFET device M7 has a source and body connected to the drain of device M3 at floating ground output node 204 and a gate coupled to the gate of diode-connected device M6. A plurality of diodes D1, D2, Dx are connected in series (head to tail) between node 200 and the drain of device M7. Specifically, the cathode of diode D1 is connected to the drain of device M7 and the anode of diode Dx is connected to node 200. A p-channel MOSFET Mt1 has a source connected to the floating ground output node 204, a drain connected to node 202 and a gate connected to the drain of device M14 and the second terminal of resistor R4. A MOSFET device Md, configured as a capacitor, is coupled between the floating ground output node 204 and the node 200, with the gate of device Md connected to node 204 and the source and drain of device Md connected to node 200. The floating ground voltage Vfg is generated at the output node 204. A p-channel MOSFET device Mt2 has a drain connected to node 202, a source connected to floating ground output node 204 and a gate connected to replica output node 206 (where a replica floating ground output voltage Vfgrep that is substantially equal to voltage Vfg is generated). An n-channel MOSFET device Mt3 has a drain connected to node 200, a source connected to replica output node 204 and a gate. An n-channel MOSFET device M4 has a gate coupled to the gate of device M1, a source connected to node 202 and a drain connected to replica output node 206. An n-channel MOSFET device M8 has a source and body connected to the drain of device M4 at replica output node 206 and a gate coupled to the gate of diode-connected device M6. A plurality of replica diodes D1r, D2r, Dxr are connected in series (head to tail) between node 200 and the drain of device M8. Specifically, the cathode of diode D1r is connected to the drain of device M8 and the anode of diode Dxr is connected to node 200. An n-channel MOSFET device M5 has a gate coupled to the gate of device M1 and a source connected to node 202. An n-channel MOSFET device M9 has a source and body connected to the drain of device M5 and a gate coupled to the gate of diode-connected device M6. A diode connected p-channel MOSFET device M10 has a drain and gate connected to the drain of device M9, and a source connected to node 200. A p-channel MOSFET device M11 has a gate coupled to the gate of device M10 and a source connected to node 200. A p-channel MOSFET device M12 has a source connected to the drain of device M11 and a gate connected to the replica output node 206. A resistor R3 has a first terminal connected to the drain of device M12 and a second terminal connected to the drain of an n-channel MOSFET device M13 and the gate of device Mt3. The gate of device M13 is connected to the first terminal of the resistor R3 at the drain of device M12.

The non-linear behavior of the variable voltage generation by the floating ground voltage generator circuit 150 in generating the floating ground voltage Vfg (see, FIG. 3) is controlled in the following manner. The plurality of diodes D1, D2, Dx function to ensure that the floating ground voltage Vfg tracks the reference voltage Gnd over the first range 170 of supply voltage Vdd levels. The voltage level of the floating ground voltage Vfg at the output node 204 is blocked by the diodes D1, D2, Dx from rising above the reference voltage Gnd until the level of the supply voltage Vdd exceeds the sum of the threshold voltages of the diodes D1, D2, Dx. This ensures that the maximum drive is available to the high side gate driver circuit 132 in the first range 170 of voltages.

The values of the resistances for the resistors R1 and R2 are chosen so that the intermediate voltage Vth at the tap node of the resistive voltage divider is equal to the supply voltage Vdd minus the targeted DC voltage level of the floating ground voltage Vfg. In other words, Vth=(Vdd*R1)/(R1+R2). So, for the floating ground voltage Vfg equal to (Vdd−Gnd)/3, the intermediate voltage Vth will equal (2*(Vdd−Gnd))/3). The current flowing through device M1 is equal to Ith=(Vth−Vgs)Rth (where Rth=R1∥R2 and Vgs is the gate-to-source voltage of device M1). A current mirror formed by n-channel MOSFET devices M1, M2, M3, M4 and M5 mirrors the current Ith. For the same current in devices M1 and M2, the gate-to-source voltage of device M6 is then also equal to the gate-to-source voltage of devices M1 and M2 (if the body and source of device M6 are tied together). This ensures that the voltage drop from supply voltage Vdd to the floating ground voltage Vfg over the second range 172 of supply voltage Vdd levels is equal to Vth (in other words, the voltage tracks the ratio metric relationship set by the resistive voltage divider).

To address concerns with large transient currents, the MOSFET devices Mt1, Mt2 and Mt3, which are biased to operate in near conduction (or almost off), are selectively turned on to dissipate the transient. The circuit formed by resistor R4 and device M14 provides a DC bias to the gate of device M14 so that this transistor is biased on the edge of conduction. Similarly, the replica floating ground voltage Vfgrep is generated and bias voltages are provided at the gates of devices Mt2 and Mt3 so that these transistors are biased on the edge of conduction. As an example of the transient current response operation, when transient current is drawn from the floating ground output node 204, the gate-to-source voltage of device Mt1 will increase and start conducting the current from voltage node 200 to be dumped at the output node 204 to raise the floating ground voltage Vfg back towards the desired target voltage level. The capacitor configured device Md decouples the output node 204 from any instantaneous switching currents.

Figure 5:
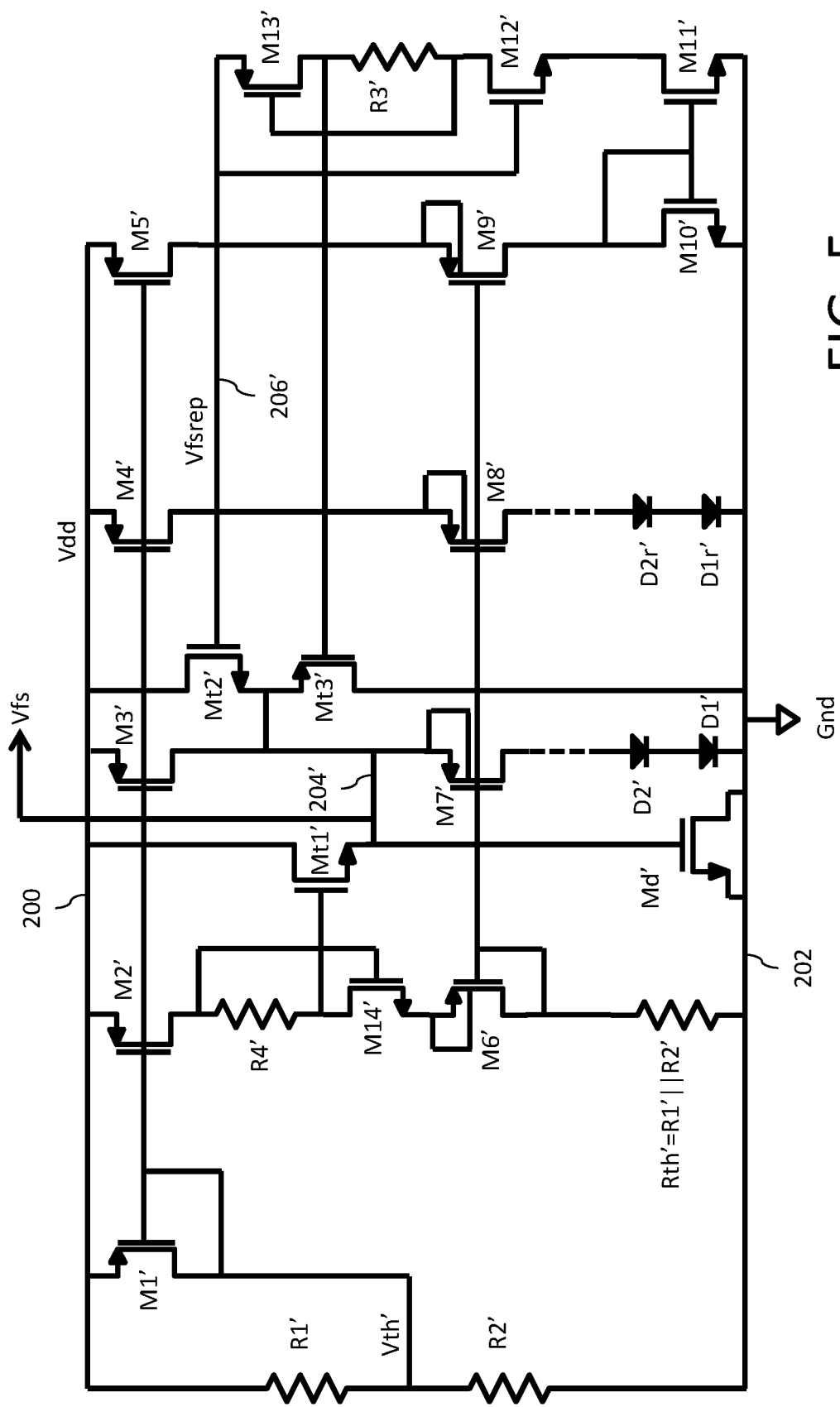
FIG. 5 is a circuit diagram for a floating supply voltage generator for cascode biasing.

Reference is now made to FIG. 5 which shows a circuit diagram for the floating supply voltage generator circuit 152 powered from the supply voltage Vdd at node 200 and the reference voltage Gnd at node 202. A resistive voltage divider formed by series connected resistors R1' and R2' generates an intermediate voltage Vth'. A diode-connected p-channel MOSFET device M1' is coupled between the tap node of the resistive voltage divider and the node 200, with the source of device M1' connected to node 200 and the gate and drain of device M1' connected to the tap node of the resistive voltage divider. A p-channel MOSFET device M2' has a gate coupled to the gate of device M1' and a source connected to node 200. A resistor R4' has a first terminal connected to the drain of device M2' and a second terminal connected to the drain of an n-channel MOSFET device M14'. The gate of device M14' is connected to the first terminal of the resistor R4'. The source of device M14' is connected to the source (and body) of a diode connected p-channel MOSFET device M6'. The gate and drain of device M6' are connected to the first terminal of a resistor Rth', where Rth'=R1'||R2'. A second terminal of resistor Rth' is connected to the node 202. A p-channel MOSFET device M3' has a gate coupled to the gate of device M1' and a source connected to node 200. A p-channel MOSFET device M7' has a source and body connected to the drain of device M3 at floating ground output node 204 and a gate coupled to the gate of diode-connected device M6'. A plurality of diodes D1', D2', Dx' are connected in series (head to tail) between node 202 and the drain of device M7'. Specifically, the cathode of diode D1' is connected to node 202 and the anode of diode Dx' is connected to the drain of device M7'. An n-channel MOSFET Mt1' has a source connected to the floating supply output node 204', a drain connected to node 200 and a gate connected to the drain of device M14' and the second terminal of resistor R4'. A MOSFET device Md', configured as a capacitor, is coupled between the floating supply output node 204' and the node 202, with the gate of device Md' connected to node 204' and the source and drain of device Md' connected to node 200. The floating supply voltage Vfs is generated at the output node 204'. An n-channel MOSFET device Mt2' has a drain connected to node 200, a source connected to floating supply output node 204' and a gate connected to replica output node 206' (where a replica floating supply output voltage Vfsrep that is substantially equal to voltage Vfs is generated). A p-channel MOSFET device Mt3 has a drain connected to node 202, a source connected to replica output node 204' and a gate. A p-channel MOSFET device M4' has a gate coupled to the gate of device M1', a source connected to node 200 and a drain connected to replica output node 206'. A p-channel MOSFET device M8' has a source and body connected to the drain of device M4' at replica output node 206' and a gate coupled to the gate of diode-connected device M6'. A plurality of replica diodes D1r', D2r', Dxr' are connected in series (head to tail) between node 202 and the drain of device M8'. Specifically, the cathode of diode D1r' is connected to node 202 and the anode of diode Dxr' is connected to the drain of device M8'. A p-channel MOSFET device M5' has a gate coupled to the gate of device M1' and a source connected to node 200. A p-channel MOSFET device M9' has a source and body connected to the drain of device M5' and a gate coupled to the gate of diode-connected device M6'. A diode connected n-channel MOSFET device M10' has a drain and gate connected to the drain of device M9', and a source connected to node 202. An n-channel MOSFET device M11' has a gate coupled to the gate of device M10' and a source connected to node 202. An n-channel MOSFET device M12' has a source connected to the drain of device M11' and a gate connected to the replica output node 206'. A resistor R3' has a first terminal connected to the drain of device M12' and a second terminal connected to the drain of a p-channel MOSFET device M13' and the gate of device Mt3'. The gate of device M13' is connected to the first terminal of the resistor R3' at the drain of device M12'.

The non-linear behavior of the variable voltage generation by the floating supply voltage generator circuit 152 in generating the floating supply voltage Vfs (see, FIG. 3) is controlled in the following manner. The plurality of diodes D1', D2', Dx' function to ensure that the floating supply voltage Vfs tracks the supply voltage Vdd over the first range 170 of supply voltage Vdd levels. The voltage level of the floating supply voltage Vfs at the output node 204' is blocked by the diodes D1', D2,' Dx' from falling below the supply voltage Vdd until the level of the supply voltage Vdd exceeds the sum of the threshold voltages of the diodes D1', D2', . . . Dx'. This ensures that the maximum drive is available to the low side gate driver circuit 134 over the first 170 of voltages.

The values of the resistances for the resistors R1' and R2' are chosen so that the intermediate voltage Vth' at the tap node of the resistive voltage divider is equal to the supply voltage Vdd minus the targeted DC voltage level of the floating supply voltage Vfs. In other words, Vth=(Vdd*R1)/(R1+R2). So, for the floating supply voltage Vfs equal to (2*(Vdd−Gnd))/3, the intermediate voltage Vth' will equal (Vdd−Gnd)/3. The current flowing through device M1' is equal to Ith=(Vth'−Vgs)Rth' (where Rth'=R1||R2 and Vgs is the gate-to-source voltage of device M1'). A current mirror formed by n-channel MOSFET devices M1', M2', M3', M4' and M5' mirrors the current Ith. For the same current in devices M1' and M2', the gate-to-source voltage of device M6' is then also equal to the gate-to-source voltage of devices M1' and M2' (if the body and source of device M6' are tied together). This ensures that the voltage drop from supply voltage Vdd to the floating supply voltage Vfs over the second range 172 of supply voltage Vdd levels is equal to Vth' (in other words, the voltage tracks the ratio metric relationship set by the resistive voltage divider).

To address concerns with large transient currents, the MOSFET devices Mt1', Mt2' and Mt3', which are biased to operate in near conduction (or almost off), are selectively turned on to dissipate the transient. The circuit formed by resistor R4' and device M14' provides a DC bias to the gate of device M14' so that this transistor is biased on the edge of conduction. Similarly, the replica floating supply voltage Vfsrep is generated and bias voltages are provided at the gates of devices Mt2' and Mt3' so that these transistors are biased on the edge of conduction. As an example of the transient current response operation, when transient current is sourced to from the floating supply output node 204', the gate-to-source voltage of device Mt1' will increase and start conducting the current from voltage node 200 to be dumped at the output node 204' to lower the floating supply voltage Vfs back towards the desired target voltage level. The capacitor configured device Md' decouples the output node 204' from any instantaneous switching currents.

Although the preceding description has been described herein with reference to particular circuits and embodiments, it is not intended to be limited to the particulars disclosed herein; rather, it extends to all functionally equivalent structures, methods, and uses, such as are within the scope of the appended claims.

The invention claimed is:

1. A circuit powered by a power supply voltage and a reference voltage, comprising:
   a power transistor;
   a cascode transistor;
   wherein the power transistor and cascode transistor are connected in series;
   wherein the power transistor and cascode transistor are part of a high side driver circuit coupled to a switching node;
   a driver circuit having an output driving a control terminal of the power transistor, wherein the driver circuit has a first power supply node coupled to receive a floating voltage that is also applied to a control terminal of the cascode transistor;
   wherein the driver circuit has a second power supply node coupled to receive the power supply voltage; and
   a variable voltage generator configured to generate the floating voltage, said variable voltage generator generating the floating voltage to track either the power supply voltage or the reference voltage over a first range of voltage levels for said power supply voltage and further generating the floating voltage to satisfy a ratio metric relationship dependent on the power supply voltage and reference voltage over a second range of voltage levels for said power supply voltage;
   wherein the variable voltage generator includes a resistive voltage divider coupled between the power supply voltage and the reference voltage, said resistive voltage generating an intermediate voltage that controls setting of the ratio metric relationship.

2. The circuit of claim 1, wherein the variable voltage generator further includes a plurality of diodes connected in series, and wherein the plurality of diodes set a voltage level that delimits an upper end of the first range of voltage levels where the floating voltage tracks the reference voltage.

3. The circuit of claim 1, wherein the ratio metric relationship sets the floating voltage as a function of a difference between the power supply voltage and the intermediate voltage.

4. The circuit of claim 1, further comprising an inductor having a first terminal coupled to the switching node and a second terminal coupled to an output node where a DC-DC converted output voltage is generated.

5. A circuit powered by a power supply voltage and a reference voltage, comprising:
   a power transistor;
   a cascode transistor;
   wherein the power transistor and cascode transistor are connected in series;
   wherein the power transistor and cascode transistor are part of a low side driver circuit coupled to a switching node;
   a driver circuit having an output driving a control terminal of the power transistor, wherein the driver circuit has a first power supply node coupled to receive a floating voltage that is also applied to a control terminal of the cascode transistor;
   wherein the driver circuit has a second power supply node coupled to receive the reference voltage; and
   a variable voltage generator configured to generate the floating voltage, said variable voltage generator generating the floating voltage to track either the power supply voltage or the reference voltage over a first range of voltage levels for said power supply voltage and further generating the floating voltage to satisfy a ratio metric relationship dependent on the power supply voltage and reference voltage over a second range of voltage levels for said power supply voltage;
   wherein the variable voltage generator includes a resistive voltage divider coupled between the power supply voltage and the reference voltage, said resistive voltage generating an intermediate voltage that controls setting of the ratio metric relationship.

6. The circuit of claim 5, wherein the variable voltage generator further includes a plurality of diodes connected in series, and wherein the plurality of diodes set a voltage level that delimits an upper end of the first range of voltage levels where the floating voltage tracks the power supply voltage.

7. The circuit of claim 5, wherein the ratio metric relationship sets the floating voltage as a function of a difference between the power supply voltage and the intermediate voltage.

8. The circuit of claim 5, further comprising an inductor having a first terminal coupled to the switching node and a second terminal coupled to an output node where a DC-DC converted output voltage is generated.

9. A circuit, comprising:
   a high side power transistor;
   a high side cascode transistor;
   wherein the high side power transistor and high side cascode transistor are connected in series between a power supply voltage and a switching node;
   a low side power transistor;
   a low side cascode transistor;
   wherein the low side power transistor and low side cascode transistor are connected in series between the switching node and a reference voltage;
   a high side driver circuit having an output driving a control terminal of the high side power transistor, wherein the high side driver circuit has a first power supply node coupled to receive the power supply voltage and a second power supply node coupled to receive a floating ground voltage that is also applied to a control terminal of the high side cascode transistor;
   a low side driver circuit having an output driving a control terminal of the low side power transistor, wherein the low side driver circuit has a first power supply node coupled to receive a floating supply voltage that is also applied to a control terminal of the low side cascode transistor and a second power supply node coupled to receive the reference voltage;
   wherein the floating ground voltage and the floating supply voltage are different voltages;

a first variable voltage generator configured to generate the floating ground voltage, wherein the floating ground voltage tracks the reference voltage over a first range of voltage levels for said power supply voltage and further satisfies a first ratio metric relationship dependent on the power supply voltage and reference voltage over a second range of voltage levels for said power supply voltage; and a second variable voltage generator configured to generate the floating supply voltage, wherein the floating supply voltage tracks the power supply voltage over the first range of voltage levels for said power supply voltage and further satisfies a second ratio metric relationship dependent on the power supply voltage and reference voltage over the second range of voltage levels for said power supply voltage;

wherein the first and second ratio metric relationships are different.

10. The circuit of claim 9, wherein the first variable voltage generator includes a resistive voltage divider coupled between the power supply voltage and the reference voltage, said resistive voltage generating an intermediate voltage that controls setting of the first ratio metric relationship.

11. The circuit of claim 10, wherein the first variable voltage generator further includes a plurality of diodes connected in series, and wherein the plurality of diodes set a voltage level that delimits an upper end of the first range of voltage levels where the floating ground voltage tracks the reference voltage.

12. The circuit of claim 10, wherein the first ratio metric relationship sets the floating ground voltage as a function of a difference between the power supply voltage and the intermediate voltage.

13. The circuit of claim 9, wherein the second variable voltage generator includes a resistive voltage divider coupled between the power supply voltage and the reference voltage, said resistive voltage generating an intermediate voltage that controls setting of the second ratio metric relationship.

14. The circuit of claim 13, wherein the second variable voltage generator further includes a plurality of diodes connected in series, and wherein the plurality of diodes set a voltage level that delimits an upper end of the first range of voltage levels where the floating supply voltage tracks the power supply voltage.

15. The circuit of claim 14, wherein the second ratio metric relationship sets the floating voltage as a function of a difference between the power supply voltage and the intermediate voltage.

16. The circuit of claim 9, further comprising an inductor having a first terminal coupled to the switching node and a second terminal coupled to an output node where a DC-DC converted output voltage is generated.

17. The circuit of claim 9, wherein the high side power transistor and the high side cascode transistor are both p-channel MOSFET devices and wherein the low side power transistor and the low side cascode transistor are both n-channel MOSFET devices.

* * * * *